US008822298B2

(12) United States Patent
Flachowsky et al.

(10) Patent No.: US 8,822,298 B2
(45) Date of Patent: Sep. 2, 2014

(54) PERFORMANCE ENHANCEMENT IN TRANSISTORS BY REDUCING THE RECESSING OF ACTIVE REGIONS AND REMOVING SPACERS

(75) Inventors: Stefan Flachowsky, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 49 days.

(21) Appl. No.: 13/421,242

(22) Filed: Mar. 15, 2012

(65) Prior Publication Data

US 2012/0235215 A1    Sep. 20, 2012

(30) Foreign Application Priority Data

Mar. 16, 2011    (DE) .................. 10 2011 005 641

(51) Int. Cl.
*H01L 29/78*     (2006.01)
*H01L 21/8238*   (2006.01)
*H01L 21/8234*   (2006.01)

(52) U.S. Cl.
CPC ..... *H01L 21/823425* (2013.01); *H01L 21/823864* (2013.01); *H01L 21/823468* (2013.01); *H01L 21/823814* (2013.01)
USPC .......... 438/303; 438/305; 438/231; 438/232; 257/288

(58) Field of Classification Search
USPC ................................ 438/299, 303
See application file for complete search history.

(56) References Cited

U.S. PATENT DOCUMENTS

| | | | |
|---|---|---|---|
| 6,335,252 B1 * | 1/2002 | Oishi et al. | 438/303 |
| 6,949,436 B2 * | 9/2005 | Buller et al. | 438/303 |
| 7,659,213 B2 * | 2/2010 | Wei et al. | 438/766 |
| 7,696,052 B2 * | 4/2010 | Wei et al. | 438/300 |
| 7,767,540 B2 * | 8/2010 | Peidous et al. | 438/424 |
| 8,039,878 B2 * | 10/2011 | Peidous et al. | 257/255 |
| 8,318,564 B2 * | 11/2012 | Scheiper et al. | 438/285 |
| 2004/0259343 A1 * | 12/2004 | Buller et al. | 438/595 |
| 2005/0026379 A1 * | 2/2005 | Kammler et al. | 438/303 |
| 2005/0095796 A1 * | 5/2005 | van Bentum et al. | 438/300 |
| 2005/0242376 A1 * | 11/2005 | Chen et al. | 257/214 |
| 2005/0247986 A1 * | 11/2005 | Ko et al. | 257/411 |
| 2005/0266639 A1 * | 12/2005 | Frohberg et al. | 438/257 |
| 2006/0003533 A1 * | 1/2006 | Kammler et al. | 438/300 |
| 2006/0024896 A1 * | 2/2006 | Huang et al. | 438/300 |
| 2007/0108525 A1 * | 5/2007 | Yang et al. | 257/351 |
| 2007/0123010 A1 * | 5/2007 | Hoentschel et al. | 438/486 |

(Continued)

FOREIGN PATENT DOCUMENTS

DE    102006015077 A1    10/2007    ............ H01L 27/092

OTHER PUBLICATIONS

Translation of Official Communication from German Patent Office for German Patent Application No. 10 2011 005 641.6 dated Oct. 28, 2011.

*Primary Examiner* — Julio J Maldonado
*Assistant Examiner* — Jaehwan Oh
(74) *Attorney, Agent, or Firm* — Amerson Law Firm, PLLC

(57)    ABSTRACT

Sophisticated transistors for semiconductor devices may be formed on the basis of a superior process sequence in which an increased space between closely spaced gate electrode structures may be obtained in combination with a reduced material loss in the active regions. To this end, an offset spacer conventionally used for laterally profiling the drain and source extension regions is omitted and the spacer for the deep drain and source areas may be completely removed.

17 Claims, 5 Drawing Sheets

(56) References Cited

U.S. PATENT DOCUMENTS

| | | | |
|---|---|---|---|
| 2007/0202653 A1* | 8/2007 | Hoentschel et al. | 438/301 |
| 2007/0252144 A1* | 11/2007 | Peidous et al. | 257/57 |
| 2007/0254461 A1* | 11/2007 | Wei et al. | 438/514 |
| 2008/0160708 A1* | 7/2008 | Nandakumar et al. | 438/299 |
| 2008/0237723 A1* | 10/2008 | Wei et al. | 257/368 |
| 2010/0078735 A1* | 4/2010 | Hoentschel et al. | 257/408 |
| 2010/0136762 A1* | 6/2010 | Beyer et al. | 438/301 |
| 2011/0024805 A1* | 2/2011 | Kammler et al. | 257/288 |
| 2011/0127617 A1* | 6/2011 | Scheiper et al. | 257/402 |
| 2011/0129972 A1* | 6/2011 | Hoentschel et al. | 438/231 |
| 2011/0156099 A1* | 6/2011 | Hoentschel et al. | 257/192 |

* cited by examiner

PERFORMANCE ENHANCEMENT IN TRANSISTORS BY REDUCING THE RECESSING OF ACTIVE REGIONS AND REMOVING SPACERS

BACKGROUND OF THE INVENTION

1. Field of the Invention

Generally, the present disclosure relates to the fabrication of integrated circuits, and, more particularly, to transistors comprising a high-k metal gate electrode formed in an early manufacturing stage.

2. Description of the Related Art

The fabrication of complex integrated circuits requires the provision of a large number of transistor elements, which represent the dominant circuit element in complex integrated circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. A MOS transistor or generally a field effect transistor, irrespective of whether an N-channel transistor or a P-channel transistor is considered, comprises so-called PN junctions that are formed by an interface of highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as the channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions so as to provide low sheet and contact resistivity in combination with desired channel controllability.

With a reduced channel length, generally a shallow dopant profile may be required in the drain and source regions, while nevertheless a moderately high dopant concentration is necessary in view of providing a low series resistance, which in turn results in a desired drive current in combination with a reduced transistor channel. A shallow dopant profile in combination with a low overall drain and source resistance is typically realized by forming so-called drain and source extension regions, which may represent extremely shallow doped areas extending below the gate electrode structure so as to appropriately connect to the channel region. On the other hand, an increased lateral offset from the channel region is adjusted on the basis of appropriately dimensioned sidewall spacers, which are used as implantation masks for forming the actual drain and source regions with a desired high dopant concentration and with an increased depth compared to the drain and source extension regions. By appropriately selecting the size of the drain and source extension regions, channel controllability may be maintained for very short channel transistors, while also providing a desired low overall series resistance in connecting the drain and source regions to the channel region. Consequently, for a desired performance of sophisticated transistor elements, a certain degree of overlap of the drain and source extension regions with the gate electrode is desirable in order to obtain a low threshold voltage and a high current drive capability. The overlap of the drain and source extension regions with the gate electrode gives rise to a specific capacitive coupling that is also referred to as Miller capacitance. Typically, a desired Miller capacitance is adjusted on the basis of implantation processes in which the drain and source dopants may be introduced in order to form the basic configuration of the drain and source extension regions, wherein the final shape of these regions may then be adjusted on the basis of a sequence of anneal processes in which implantation-induced damage is re-crystallized and also a certain degree of dopant diffusion may occur, thereby finally determining the resulting Miller capacitance.

Upon continuously reducing the channel length of field effect transistors, generally an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high performance transistors, which may, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, in particular for devices designed for low power applications, such as mobile devices and the like, other alternatives have been developed in increasing the charge carrier mobility in the channel region, thereby also enhancing overall performance of field effect transistors. One promising approach in this respect is the generation of a certain type of strain in the channel region, since the charge carrier mobility in silicon strongly depends on the strain conditions of the crystalline material. For example, for a standard crystallographic configuration of the silicon-based channel region, a compressive strain component in a P-channel transistor may result in a superior mobility of holes, thereby increasing switching speed and drive current of P-channel transistors.

One efficient mechanism for inducing a desired strain in the channel region of transistors is the deposition of a highly stressed material in close proximity to the transistors. To this end, frequently, in the contact level of the device, i.e., the interlayer dielectric material passivating the transistors and separating the transistors from the metallization system, appropriate materials may be provided, for instance in the form of a highly stressed silicon nitride material and the like, so that the internal stress may efficiently act on the channel region of the underlying transistors. In sophisticated device geometries, however, generally the deposition of an interlayer dielectric material in a void-free manner is difficult to achieve since the lateral distance between closely spaced gate electrode structures is in the range of 150 nm and significantly less. In particular, in combination with the above-described strain-inducing mechanism, deposition-related irregularities, such as voids, are frequently produced upon forming the highly stressed dielectric material since, in this case, the deposition conditions are significantly determined by the requirement of inducing a high internal stress level upon depositing the dielectric material.

Furthermore, in view of reducing static and dynamic leakage currents for low power applications, such as mobile devices and the like, an appropriate adaptation of the material composition of the gate dielectric material has been contemplated so that, for a physically appropriate thickness of a gate dielectric material, i.e., for obtaining an acceptable level of gate leakage currents, nevertheless, a desired high capacitive coupling is achieved. To this end, material systems have been developed, which have a significantly higher dielectric constant compared to the conventionally used silicon dioxide-based materials, such as silicon oxynitride and the like. For example, dielectric material including hathium, zirconium, aluminum and the like have a significantly higher dielectric constant and are, therefore, referred to as high-k dielectric materials, which are to be understood as materials having a dielectric constant of 10.0 and higher. Frequently, these high-k dielectric materials are provided in an early manufacturing stage, i.e., upon forming the gate electrode structures, possibly in combination with additional metal-containing electrode materials, which are used to appropriately adjust the work function and thus the threshold voltage of the transistors. Since these materials may sensitively respond to a plurality of reactive process atmospheres encountered during the further processing of the devices, an encapsulation of these materials may have to be ensured, which is typically accomplished by forming an appropriate silicon nitride spacer element on sidewalls of the sensitive gate materials immediately after patterning the complex gate layer stack.

Basically, the above-described process sequence allows providing potentially sophisticated semiconductor devices designed for low power applications, while nevertheless the individual transistor elements exhibit a more or less high performance, for instance due to the overall reduced size in combination with, for instance, moderately low gate leakage currents achieved by the provision of a high-k dielectric material. It turns out, however, that significant yield loss may be observed in semiconductor devices formed on the basis of the above-described process flow, while additionally overall performance is lower than expected, although sophisticated transistor designs and material compositions in the gate electrode structures may be used.

With reference to FIGS. 1a and 1b, a typical complex manufacturing flow for forming semiconductor devices on the basis of reduced critical dimensions, for instance with gate lengths of 40 nm and less, will be described in more detail.

FIG. 1a schematically illustrates a cross-sectional view of a semiconductor device 100 in a very advanced manufacturing stage. As shown, the device 100 comprises a substrate 101 and a semiconductor layer 102, which may in combination form a silicon-on-insulator (SOI) architecture when a buried insulating material (not shown) is formed below the semiconductor layer 102. In other cases, a bulk configuration is used in which the semiconductor layer 102 is in direct contact with a crystalline semiconductor material of the substrate 101. The semiconductor layer 102 comprises a plurality of active regions which are to be understood as semiconductor regions that are laterally delineated by appropriate isolation structures 102C and in and above which one or more transistors are formed. For convenience, in FIG. 1a, an active region 102A is illustrated so as to comprise transistors 150A, 150B. The transistors 150A, 150B may represent P-channel transistors or N-channel transistors and comprise drain and source regions 152, which are formed on the basis of drain and source extension regions 152E and deep drain and source areas 152D. Furthermore, in order to improve the overall series resistance, a metal silicide material 153 is typically provided in the drain and source regions 152. Moreover, the transistors 150A, 150B comprise respective gate electrode structures 160, which in turn include a gate dielectric material 161 which typically includes, as discussed above, a high-k dielectric material, such as hafnium oxide and the like. It should be appreciated that also conventional dielectric components or species, such as silicon oxide-based materials, silicon oxynitride and the like, may be implemented in the gate insulation layer 161 in order to provide stable interface characteristics and the like. Moreover, an electrode material 162, which may comprise specific work function metal species or other metal-containing electrode materials, such as titanium nitride, tantalum, tantalum nitride and the like, is formed on the gate dielectric material 161 and may also comprise a significant amount of a semiconductor material, such as silicon. Moreover, in the manufacturing stage shown, a metal silicide 163 is provided so as to enhance the electronic characteristics of the gate electrode structures 160. Furthermore, as discussed above, a sidewall spacer 164 is formed so as to laterally enclose sensitive gate materials, such as the gate dielectric material 161 and also the electrode material 162. To this end, a dense silicon nitride material is frequently used. Furthermore, a spacer 165, for instance comprised of silicon dioxide, is provided and typically has a width that is appropriate for incorporating the drain and source dopant species for the extension regions 152E. Furthermore, a further spacer 166, such as a silicon nitride spacer, is provided and may have, in the manufacturing stage shown, a reduced width in order to increase a lateral distance 150X between the gate electrode structures 160 prior to the further processing.

The semiconductor device 100 as shown in FIG. 1a may be formed on the basis of the following process strategy. The active region 102A is typically provided by forming isolation regions 102C, such as trench isolations, using well-established and complex lithography, etch, deposition and planarization techniques. Thereafter, appropriate materials for the gate dielectric layer 161 and the electrode material 162 are provided in combination with hard mask materials, for instance in the form of silicon nitride and the like. It should be appreciated that, if required, prior to providing a semiconductor-based electrode material, patterning processes may be applied in combination with appropriate deposition processes in order to provide work function metal species that comply with the requirements of P-channel transistors and N-channel transistors, respectively. After the complex process for patterning the materials 161 and 162, the liner material for the spacer element 164 is deposited, possibly in combination with the material of the spacer 165 and is thus patterned on the basis of, for instance, anisotropic etch strategies, followed by the patterning of the spacer 165. Consequently, these patterning processes cause a significant loss of material of the active region 102A thereby contributing to a significant recessing, as indicated by 150Y, after completing the basic transistor configuration. On the basis of the spacer element 165, the drain and source extension regions 152E are formed by ion implantation, possibly in combination with the incorporation of a counter-doping species in order to locally increase the well dopant concentration in the active region 102A, the basic dopant profile of which may have been adjusted prior to forming the gate electrode structures 160. Next, the spacer 166 may be formed, for instance, by depositing a silicon nitride material and patterning the same followed by a further implantation process in order to incorporate the dopant species for the deep drain and source areas 152D. It should be appreciated that the spacers 166 are provided so as to comply with the requirements for implementing a desired complex lateral and vertical dopant profile. The final dopant profile may then be established during one or more anneal processes, thereby also activating the dopant species and re-crystallizing implantation-induced damage. In some approaches, the width of the spacer elements 166 may be reduced by performing an appropriate etch process in order to obtain an increased lateral distance, as indicated by the distance 150X, in order to improve the conditions for the subsequent deposition of an interlayer dielectric material. In this case, also a certain loss of material in the active region 102A may be induced, thereby also contributing to the final degree of recessing 150Y. Thereafter, well-established silicidation techniques are applied in order to form the materials 153 and 163, wherein typically, at any appropriate manufacturing stage, the hard mask material is removed from above the electrode material 162, for instance upon reducing the width of the spacer 166 and the like.

FIG. 1b schematically illustrates the device 100 in a further advanced manufacturing stage. As illustrated, a first dielectric material 121 of a contact level 120 is formed above the active region 102A and the gate electrode structures 160. As explained above, frequently, the material 121 is provided in the form of a highly stressed dielectric material, such as a silicon nitride material, which is deposited on the basis of plasma enhanced chemical vapor deposition (CVD) techniques in which process parameters are adjusted such that a desired high internal stress is obtained. For example, when the transistors 150A, 150B are P-channel transistors, the material 121 is formed so as to have a high internal compressive stress. The deposition of the material 121, on the one hand, can provide a moderately thick layer with a high internal stress level in order to enhance performance of the transistors 150A, 150B, thereby requiring specific process parameters which, however, may not provide the required gap filling capabilities so as to completely fill the space between the gate electrode structures 160. Consequently, for densely packed device areas, even the reduction in width of the spacer 166 for obtaining the distance 150X may thus result in a void 121V positioned between the gate electrode structures 160. The void 121V may, however, result in device failures during the further processing, for instance upon forming a further interlayer dielectric material 122 and patterning the same so as to form contact openings 123 therein. In this case, the opening 123 may connect to the void 121V, which, however, may extend along a width direction, i.e., along a direction perpendicular to the drawing plane of FIG. 1b, so that, upon filling the contact opening 123, conductive material may be deposited in the void 121V, thereby forming a buried "tungsten channel" which may short adjacent contact elements, thereby causing significant yield loss.

As a consequence, the process strategy described above may cause significant yield loss in a final stage of forming the transistors 150A, 150B, while also the pronounced recessing 150Y may contribute to reduced transistor performance.

In view of the situation described above, the present disclosure relates to manufacturing techniques and semiconductor devices in which semiconductor devices, including field effect transistors formed with critical dimensions of 40 nm and less, may be provided, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which superior transistor performance may be achieved for a given configuration of transistors by modifying, for otherwise given transistor configurations, the conditions upon depositing an interlayer dielectric material, while also reducing undue recessing of active regions of the transistors. To this end, drain and source extension regions, possibly in combination with counter-doped regions or halo regions, may be formed on the basis of a protective liner material, which may also be used during the further processing for forming spacer elements used to incorporate the drain and source dopant species for deep drain and source areas. In this manner, the degree of recessing of the active region in the vicinity of the gate electrode structures may be reduced, thereby providing superior transistor characteristics, since, for instance, the reduced lateral offset of the implantation entry point may enable the application of a reduced implantation dose, while nevertheless obtaining the desired overlap between the gate electrode and the extension regions. Furthermore, a superior overall series resistance may be accomplished by enabling an increase in size of the corresponding metal silicide regions due to the reduced material loss in the active regions. Moreover, due to the patterned liner material, the additional spacer element used for adjusting the lateral profile of the deep drain and source areas may be efficiently removed, thereby increasing the space between closely spaced gate electrode structures, which in turn may enable the deposition of an interlayer dielectric material, for instance in the form of a highly stressed material, without inducing deposition-related irregularities for otherwise given transistor dimensions.

One illustrative method disclosed herein relates to a method of forming a semiconductor device. The method comprises forming a protective liner above an active region and a gate electrode structure that is formed on the active region and that comprises a dielectric cap layer. The method further comprises forming drain and source extension regions in the active region in the presence of the protective liner. Moreover, a spacer structure is formed on the protective liner. The method further comprises removing an exposed portion of the protective liner by using the spacer structure as an etch mask. Additionally, the method comprises forming drain and source regions by forming deep drain and source areas in the active region in the presence of the spacer structure.

A further illustrative method disclosed herein comprises forming a protective liner above an active region of a transistor, wherein the protective liner covers a gate electrode structure that is formed on the active region. The method further comprises forming drain and source extension regions by incorporating a drain and source dopant species in the active region through the protective liner. The method further comprises forming a spacer element on sidewalls of the gate electrode structure and forming drain and source regions in the active region by using the spacer element as an implantation mask. Furthermore, the method comprises removing the spacer element and the dielectric cap layer of the gate electrode structure after forming the drain and source regions.

One illustrative semiconductor device disclosed herein comprises an active region formed above a substrate and a gate electrode structure formed on the active region. The gate electrode structure comprises an electrode material and a gate dielectric layer including a high-k dielectric material. The semiconductor device further comprises a protective liner having a first portion formed on sidewalls of the electrode material and the gate dielectric material, wherein the protective liner has a second portion that is formed on the active region. Furthermore, drain and source regions are formed in the active regions and a strain-inducing dielectric material is formed adjacent to and in contact with the protective liner.

BRIEF DESCRIPTION OF THE DRAWINGS

The disclosure may be understood by reference to the following description taken in conjunction with the accompanying drawings, in which like reference numerals identify like elements, and in which.

Figure 1A:
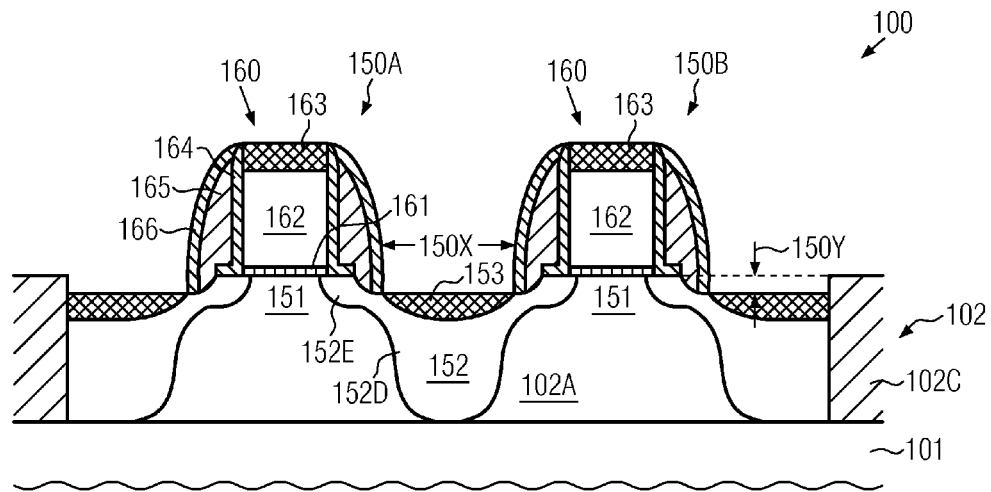
FIGS. 1a and 1b schematically illustrate cross-sectional views of a semiconductor device during various manufacturing stages in which a pronounced recessing of the active region and deposition-related irregularities upon forming an interlayer dielectric material may result in reduced device performance, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which transistors may be formed on the basis of a superior manufacturing strategy, which may result in superior transistor performance and higher production yield for otherwise given design requirements. For example, in particular in low power applications, the transistor elements of semiconductor devices have to be provided on the basis of small critical dimensions, such as 40 nm and less, when the gate length of a field effect transistor is considered, while, typically, sophisticated gate materials, such as a high-k dielectric material, has to be incorporated into the gate electrode structures. Moreover, in device areas with a high "transistor density," the formation of a dielectric layer that is used as an etch stop material and/or as a strain-inducing mechanism upon forming the contact level of the device, the lateral distance between the gate electrode structures may be increased by omitting spacer elements which are conventionally used for incorporating the drain and source extension species. Furthermore, the spacer used for determining the lateral dopant profile of deep drain and source areas may also be removed in a highly efficient manner, thereby resulting in superior deposition conditions for otherwise given geometric constraints of the semiconductor device.

Figure 1B:
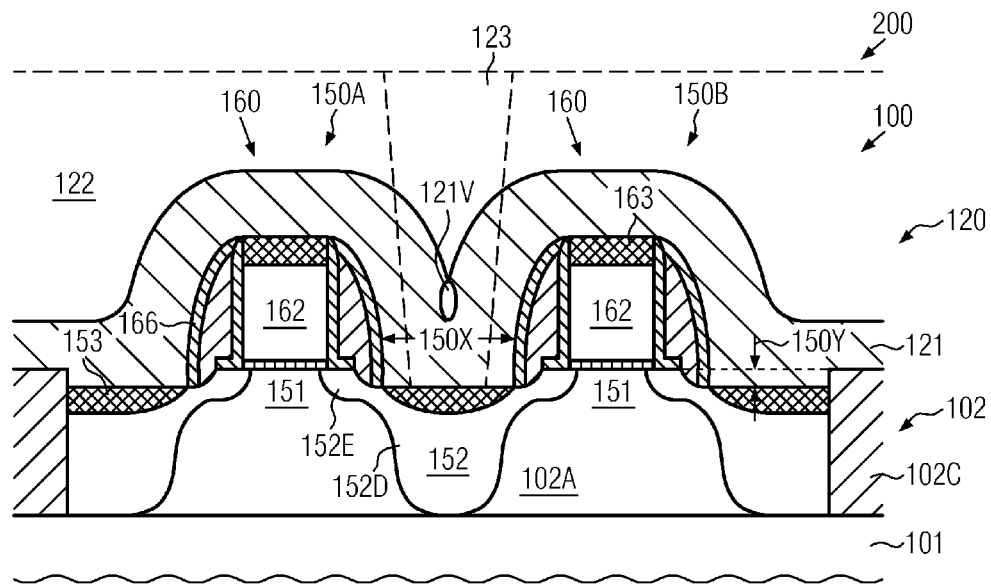

With reference to FIGS. 2a-2h, further illustrative embodiments will now be described in more detail, wherein reference may also be made to FIGS. 1a-1b, if required.

Figure 2A:
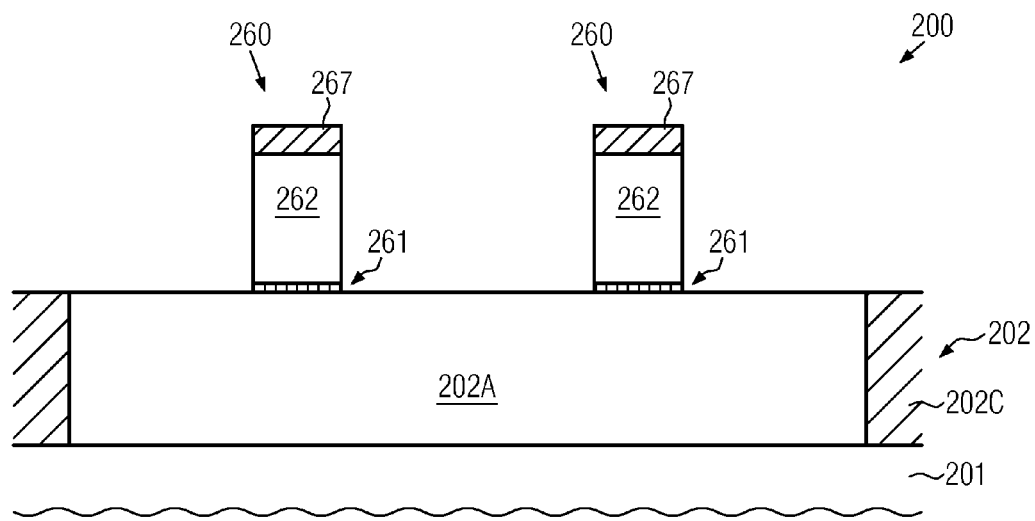
FIGS. 2a-2h schematically illustrate cross-sectional views of a semiconductor device during various manufacturing stages in forming one or more transistors having superior performance and resulting in higher production yield by avoiding deposition-related irregularities, according to illustrative embodiments.

FIG. 2a schematically illustrates a cross-sectional view of a semiconductor device 200 comprising a substrate 201 and a semiconductor layer 202. As already discussed above with reference to the device 100, the substrate 201 and the semiconductor layer 202 may form an SOI configuration or a bulk configuration, as required by the overall concept of the device 200. Furthermore, the semiconductor layer 202 may be divided into a plurality of active regions by means of an isolation region 202C, which may be provided in the form of a shallow trench isolation and the like. For convenience, a single active region 202A is illustrated in FIG. 2a. Furthermore, in this manufacturing stage, gate electrode structures 260 may be formed on the active region 202A. In this manufacturing stage, the gate electrode structures 260 may comprise a gate dielectric layer 261, which, in some illustrative embodiments, may include a high-k dielectric material, as is also discussed above, followed by one or more electrode materials 262, such as a metal-containing electrode material (not shown) in combination with a semiconductor-based material. Furthermore, a dielectric cap layer 267, for instance comprised of silicon dioxide, may be formed above the electrode material 262. It should be appreciated that the dielectric layer 261 and the electrode material 262 may have any appropriate configuration as required for implementing a desired work function and thus threshold voltage of transistors to be formed in and above the active region 202A. Similarly, the active region 202A may comprise an appropriate semiconductor alloy (not shown) at a surface thereof, if considered appropriate or necessary for adjusting the corresponding transistor characteristics. For example, any such semiconductor alloy, such as a silicon/germanium alloy, may be provided for some transistors only, if any such transistors require specific threshold voltage values.

The semiconductor device 200 as shown in FIG. 2a may be formed on the basis of the following processes. After forming the isolation region 202C, which may be accomplished by lithography, etch, deposition, anneal and planarization techniques, the basic dopant concentration may be formed in the active region 202A in compliance with the characteristics of the one or more transistors to be formed in and above the active region 202A. To this end, well-established implantation techniques in combination with masking regimes may be applied. Thereafter, the gate electrode structures 260 may be formed by depositing or generally forming appropriate materials for the layer 261 and at least a portion of the material 262, which may be patterned, if required, in order to appropriately adjust the work function of the gate electrode structures 260 with respect to other gate electrode structures in other device areas. In other cases, a single electrode material 262 may be appropriate for obtaining the desired transistor characteristics. Hence, after the deposition of the material 262 and the cap material 267, possibly in combination with other materials, such as anti-reflective coating (ARC) materials and the like, a complex patterning process may be applied so as to form the gate electrode structures 260 with the desired lateral dimensions. For example, a length of the gate electrode structures 260, i.e., the horizontal extension of the electrode material 262, may be 40 nm and less in sophisticated applications. It should be appreciated that, in some illustrative embodiments, the cap material 267 may be provided in the form of a material that may have substantially the same etch characteristics of a spacer structure that may be provided in a later manufacturing stage so as to form deep drain and source areas in the active region 202A.

Figure 2B:
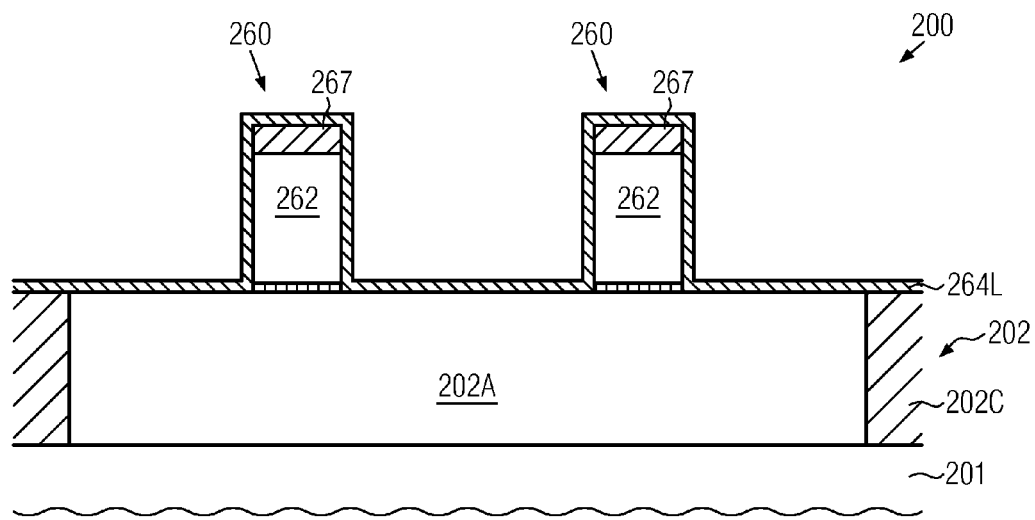

FIG. 2b schematically illustrates the device 200 with a protective liner 264L formed on any exposed portions of the active region 202A and on surface areas of the gate electrode structures 260. To this end, well-established deposition techniques, such as multi-layer deposition processes, low pressure chemical vapor deposition (LPCVD) or any combination thereof, may be applied in order to provide a silicon nitride material having a thickness of one to several nanometers. It should be appreciated that any such deposition techniques for forming a highly conformal silicon nitride material are well established in the art.

Figure 2C:
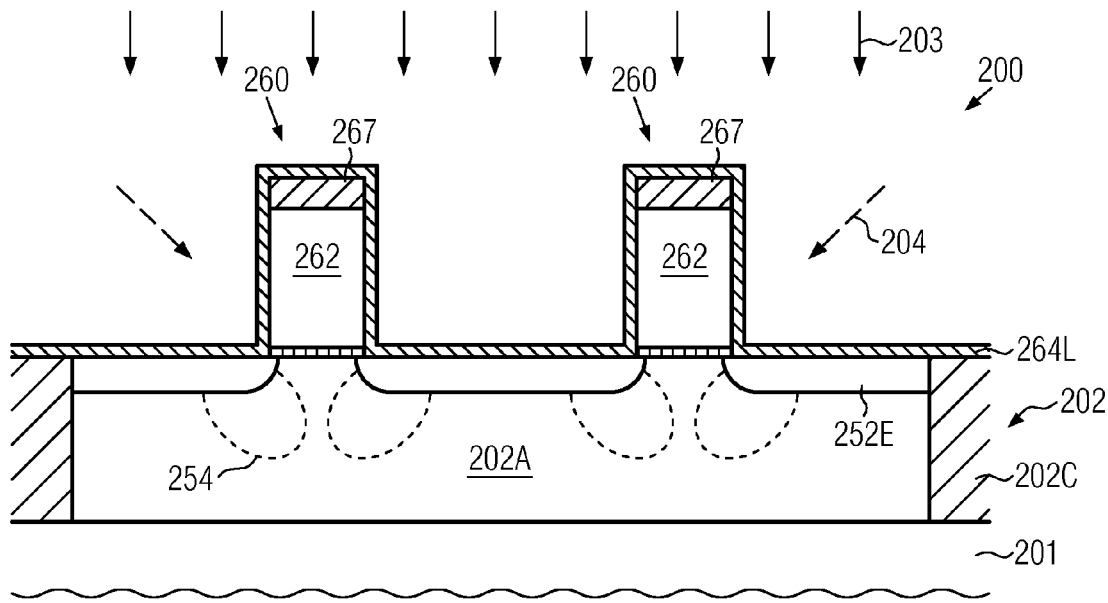

FIG. 2c schematically illustrates the device 200 during one or more implantation processes 203, 204. For example, during the implantation process 203, a drain and source dopant species may be incorporated into the active region 202A, thereby forming source and drain extension regions 252E. Thus, during the implantation process 203, the protective liner 264L is present and substantially determines the lateral offset of the entry point of the process 203 with respect to the electrode material 262. Due to the highly conformal deposition of the material 264L, the offset is substantially determined by the initial layer thickness of one to several nanometers, thereby enabling a desired overlap of the drain and source extension regions 252E with the electrode material 262 on the basis of a reduced implantation dose. Consequently, the resulting PN junction of the extension regions 252E has a reduced concentration gradient compared to conventional transistors formed on the basis of dedicated offset spacers, such as the spacer 165 as shown in FIGS. 1a and 1b, which may thus reduce the gate-induced drain leakage. It should be appreciated that other implantation parameters, such as implantation energy, may be readily adapted to the presence of the liner 264L in order to obtain the desired penetration depth.

Thereafter, if required, the further implantation process 204 may be applied so as to incorporate a counter-doping species in order to form counter-doped or halo regions 254, wherein the term counter-doped is to be understood with respect to the conductivity type of the drain and source extension regions 252E. Also in this case, the reduced lateral offset provided by the protective liner 264L may result in a reduced implantation energy during the process 204, thereby also contributing to superior process conditions.

After the implantation processes 203, 204, the processing may be continued by depositing a spacer layer which, in some illustrative embodiments, may be formed on the basis of a dielectric material having very similar etch characteristics compared to the cap layer 267. For example, the spacer layer may be provided in the form of a silicon dioxide material, which may be deposited on the basis of well-established deposition techniques. Thereafter, a patterning process may be performed in which the protective liner 264L may be efficiently used as an etch stop layer so as to obtain sidewall spacer elements.

Figure 2D:
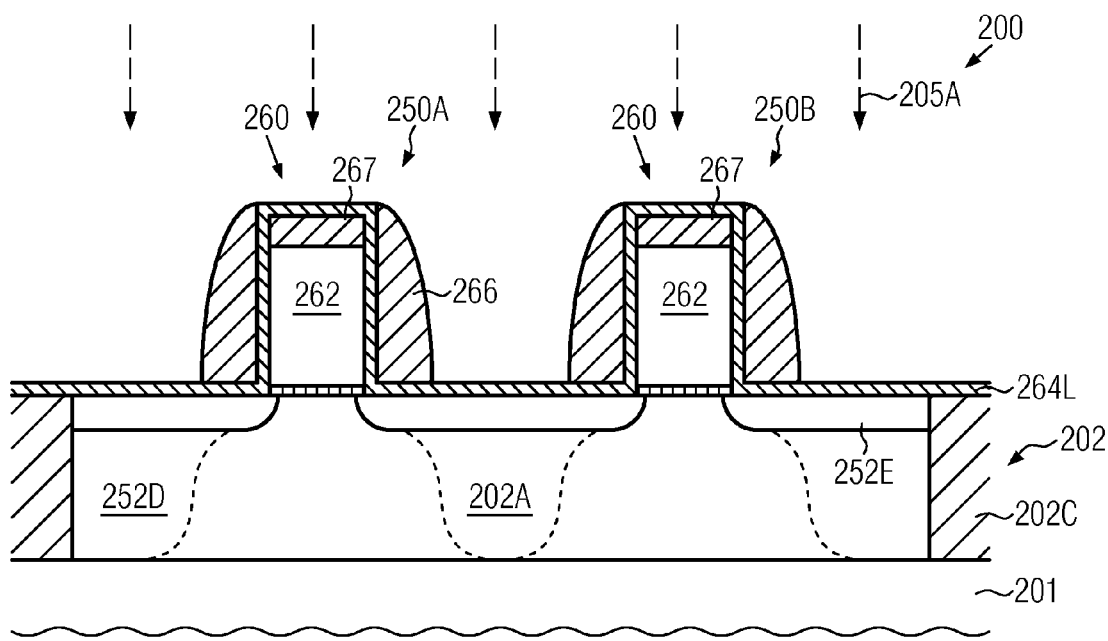

FIG. 2d schematically illustrates the semiconductor device 200 with a spacer 266 formed on the liner 264L. To this end, a process sequence may be applied, as described above. Consequently, the positioning of the drain and source extension regions 252E with respect to the gate electrode structure 260 and the patterning of the spacer elements 266 may be accomplished without unduly contributing to a material erosion of the active region 202A. In some illustrative embodiments, a further implantation process 205A may be performed so as to incorporate the dopant species for deep drain and source areas 252D, which may be accomplished in the presence of the liner 264L, as shown in FIG. 2d. On the other hand, the spacer element 266 may define the lateral profile of the deep drain and source regions 252D. In other illustrative embodiments, the implantation process 205A may be omitted in this manufacturing stage.

Figure 2E:
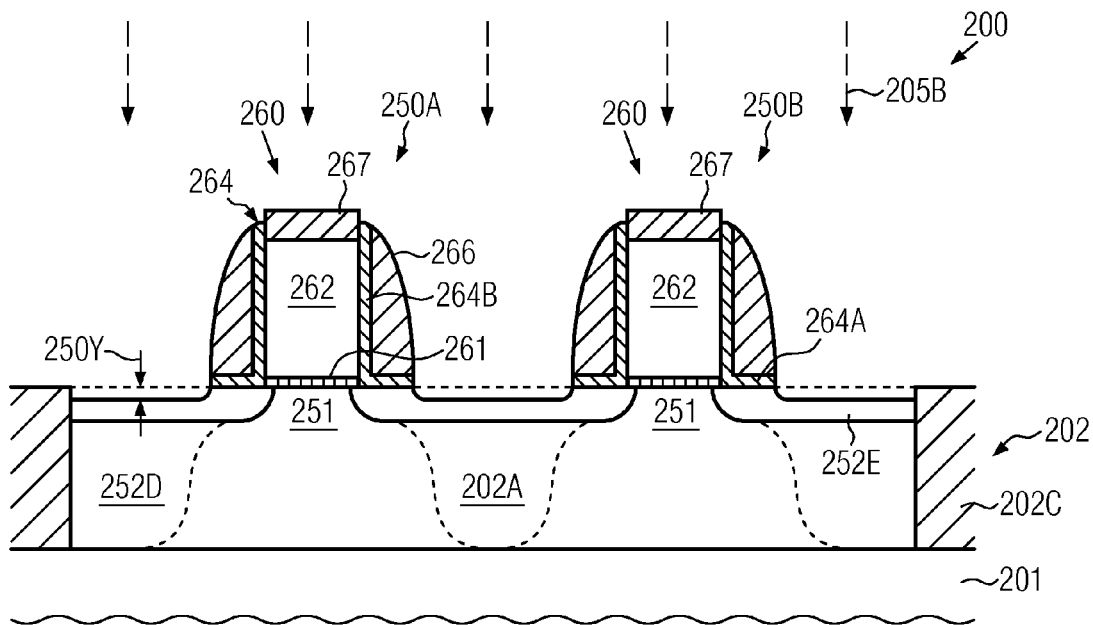

FIG. 2e schematically illustrates the semiconductor device 200 in a further advanced manufacturing stage. As shown, the liner 264L (FIG. 2d) may be patterned so as to remove any exposed portions thereof, thereby forming a protective liner or spacer 264 having a first portion 264B formed on sidewalls of the gate electrode structure 260 and thus confining the materials 261 and 262. Furthermore, the spacer or liner 264 comprises a second portion 264A formed on the active region 202A, i.e., the extension regions 252E, wherein the lateral extension of the portion 264A is substantially determined by the width of the spacer 266. The patterning of the liner 264L (FIG. 2d) may be accomplished on the basis of a "mild" etch process, for instance, based on wet chemical etch chemistries or plasma assisted etch recipes, wherein a plurality of selective etch recipes are available for etching silicon nitride selectively with respect to silicon dioxide and silicon material. During the corresponding etch process, a certain degree of recessing, as indicated by 250Y, may be generated, however, with a significantly lesser degree compared to the pronounced recessing of the active region 102A of the semiconductor device 100 as shown in FIGS. 1a and 1b. Moreover, it is to be appreciated that the recessing 250Y is laterally offset from the gate electrode material 262 by the spacer 266.

As discussed above with reference to FIG. 2d, the patterning of the liner 264L may be performed after incorporating the deep drain and source areas 252D so that the liner may still act as an efficient etch stop material upon performing several masking steps and resist removal processes, as are typically required for incorporating the drain and source dopants for transistors of different conductivity type. In other cases, as shown in FIG. 2e, an implantation process 205B for forming the deep drain and source areas 252D may be applied after forming the protective liner or spacer 264. Thereafter, one or more anneal processes may be applied so as to adjust the final vertical and lateral dopant profile and also to re-crystallize implantation-induced damage. In this case, superior efficiency may be obtained, in particular in the vicinity of channel regions 251 with respect to dopant activation and re-crystallization due to the reduced implantation dose used for forming the extension regions 252E.

Figure 2F:
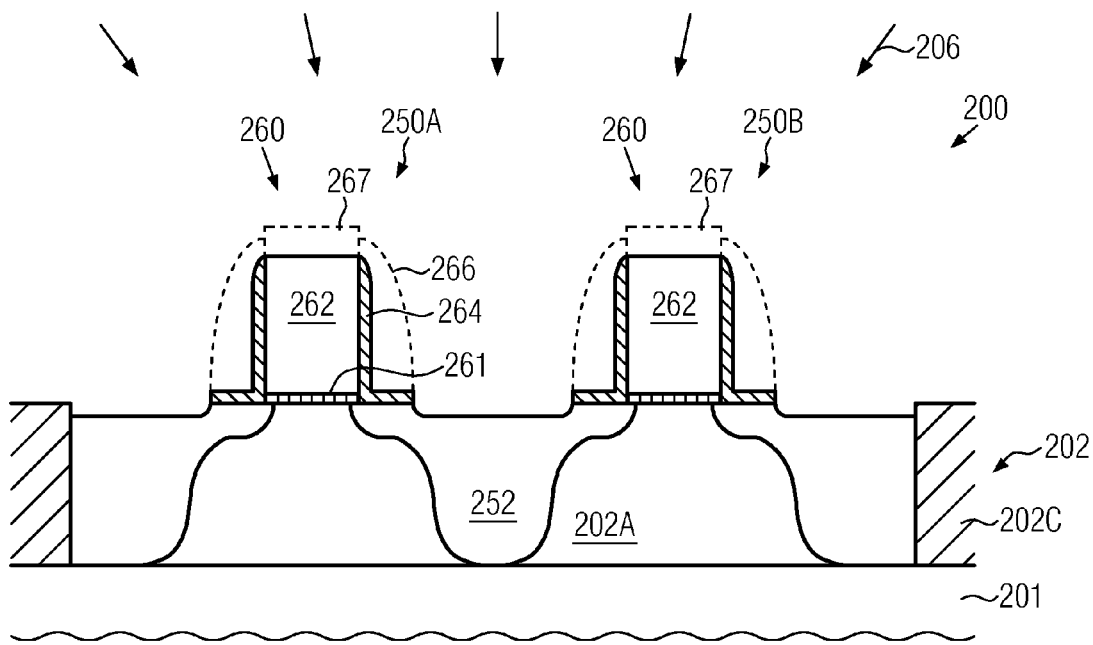

FIG. 2f schematically illustrates the device 200 in a further advanced manufacturing stage in which an etch process 206 may be applied so as to remove the spacer 266, wherein, as previously discussed, at the same time, the dielectric cap layer 267 may be removed. For example, the etch process may be performed on the basis of hydrofluoric acid (HF) if the components 266 and 267 are substantially comprised of silicon dioxide. In this case, the spacer 264 may act as an efficient etch stop material, while also high selectivity with respect to the active region 202A and the electrode material 262 may be achieved in order to avoid undue material erosion in these components. On the other hand, in some illustrative embodiments, the etch process 206 may at the same time prepare any exposed surface areas of the active region 202A and also the material 262 for a subsequent process for forming a metal silicide, thereby contributing to a highly efficient overall manufacturing flow. At the same time, the removal of the spacer structure 266 may result in an increase of the distance between the gate electrode structures 260. On the other hand, the L-shaped spacer 264 may nevertheless provide an efficient silicidation mask in order to determine the lateral offset of a metal silicide material to be formed in drain and source regions 252.

Figure 2G:
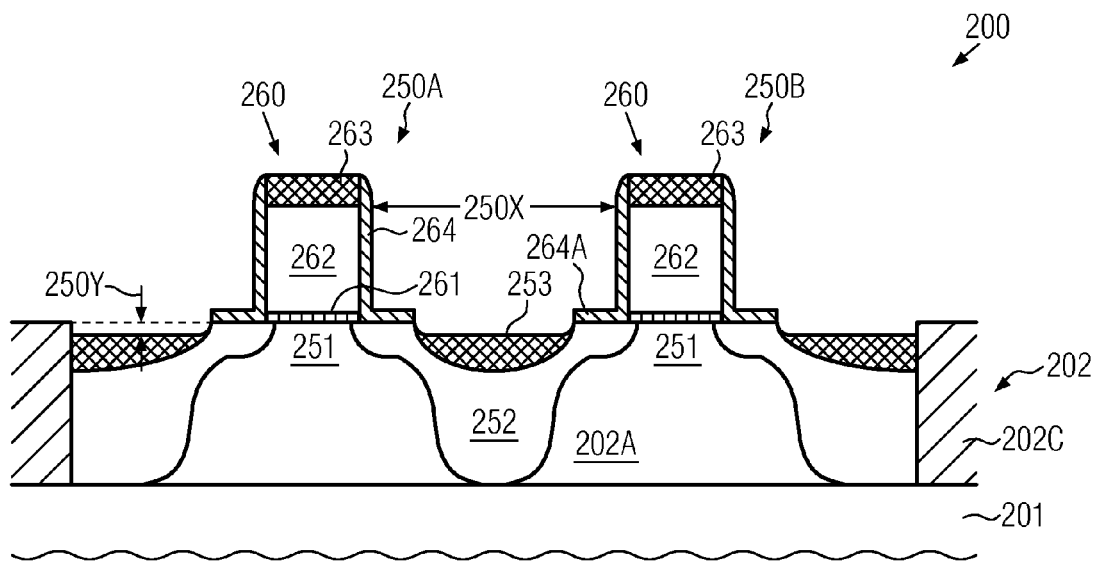

FIG. 2g schematically illustrates the device 200 in a further advanced manufacturing stage. As shown, the basic configuration of transistors 250A, 250B is completed, i.e., a metal silicide 253 is formed in the drain and source regions 252 and also a metal silicide 263 is formed in the gate electrode structures 260. To this end, any appropriate silicidation technique may be applied. As discussed above, the lateral offset of the metal silicide region 253 is substantially determined by the portion 264A of the liner or spacer 264. Moreover, for a given geometric configuration of the device 200, a lateral space between the gate electrode structures 260 may be increased, as indicated by the lateral distance 250X, due to the complete removal of the spacer element 266 (FIG. 2e) and due to the absence of any further spacer elements, such as offset spacers used in the conventional approach in the form of the spacer elements 165 (FIGS. 1a, 1b). Consequently, during a subsequent deposition process, significantly less critical surface conditions are encountered, which may result in a significantly reduced probability of creating deposition-related irregularities. Furthermore, as indicated, the recessing 250Y may also be significantly less pronounced compared to the conventional strategies, thereby enabling providing an increased thickness of the metal silicide region 253, which in turn may result in superior contact resistivity.

Figure 2H:
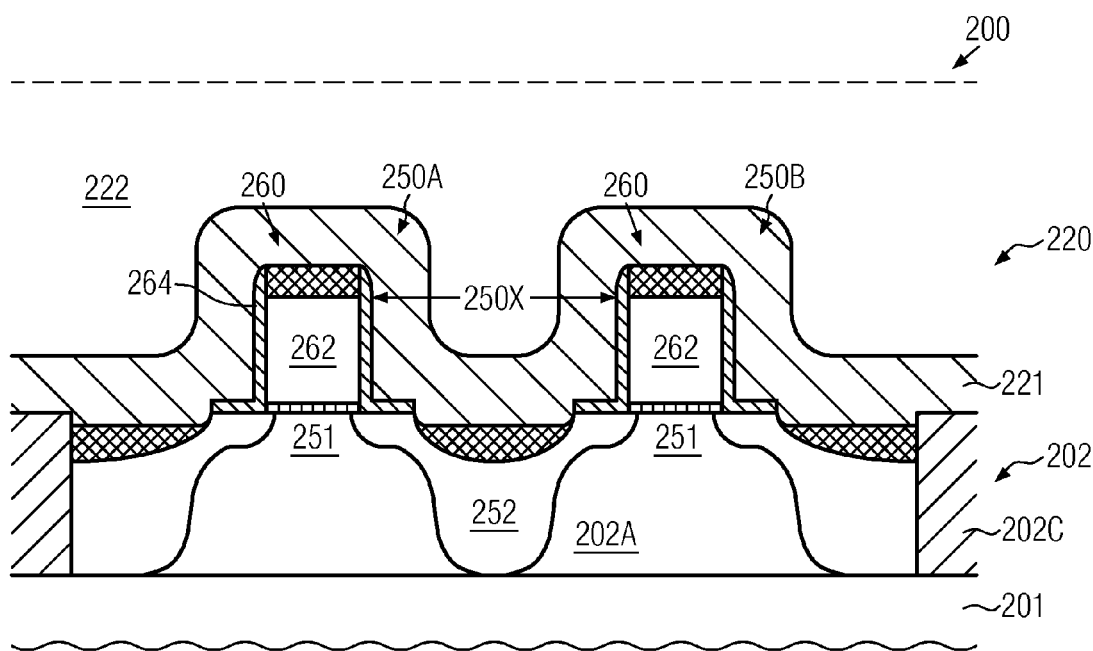

FIG. 2h schematically illustrates the device 200 in a further advanced manufacturing stage. As shown, a first dielectric layer 221 of a contact level 220 may be formed above the active region 202A and the gate electrode structures 260. Due to the increased distance 250X, the layer 221 may be provided with a desired layer thickness with a significantly reduced probability of creating any voids, which may conventionally contribute to pronounced yield losses due to buried tungsten channels, as discussed above. Hence, a further dielectric material 222 may be reliably patterned on the basis of the material layer 221 and subsequently contact openings may be formed, as is also discussed above with reference to the device 100. It should be appreciated that, in some illustrative embodiments, at least the material layer 221 may be provided with a high internal stress level in order to further enhance performance of the transistors 250A, 250B, wherein an increased amount of stressed material may be provided due to the increased distance 250X, or wherein, for a given layer thickness, the probability of creating deposition-related voids may be significantly reduced.

As a result, the present disclosure provides manufacturing techniques and semiconductor devices in which the omission of an offset spacer for profiling the drain and source extension regions in combination with an efficient removal of the spacer used for forming the deep drain and source areas may result in a final transistor geometry that significantly relaxes any constraints for the deposition of an interlayer dielectric material, such as a highly stressed dielectric material. At the same time, the silicon loss in the active region is significantly lower and is offset farther away from the channel region, thereby also contributing to enhanced electrical device characteristics. Finally, since process steps such as deposition of an offset spacer material and the patterning thereof may be omitted, overall throughput of the overall fabrication process may be increased. Hence, high performance transistors for low power applications may be provided with superior characteristics and higher production yield at an increased overall throughput.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    forming a protective liner above an active region and a gate electrode structure formed on said active region, said gate electrode comprising a dielectric cap layer, wherein the protective liner is formed on and in contact with the gate electrode structure and on and in contact with an upper surface of the dielectric cap layer;
    performing a first ion implantation process to form drain and source extension regions in said active region in the presence of said protective liner;
    forming a spacer structure on and in contact with said protective liner;
    removing an exposed portion of said protective liner by using said spacer structure as an etch mask so as to thereby expose the upper surface of the dielectric cap layer and portions of the active region; and
    performing a second ion implantation process to form drain and source regions by forming deep drain and source areas in said exposed portions of the active region in the presence of said spacer structure.

2. The method of claim 1, further comprising performing a common etching process to remove the spacer structure and said dielectric cap layer, wherein a non-removed portion of said protective liner acts as an etch stop material during the common etching process.

3. The method of claim 2, further comprising forming a metal silicide in said gate electrode structure and said drain and source regions.

4. The method of claim 1, further comprising forming a strain-inducing dielectric material above said drain and source regions and above said gate electrode structure.

5. The method of claim 1, further comprising performing a third implantation process so as to introduce a counter doping species in the presence of said protective liner.

6. The method of claim 1, wherein forming said spacer structure comprises depositing a silicon oxide material and patterning said silicon oxide material so as to form a spacer element.

7. The method of claim 6, further comprising forming said dielectric cap layer from a silicon oxide material.

8. The method of claim 1, further comprising forming said gate electrode structure with a gate length of 40 nm or less.

9. A method, comprising:
   forming a protective liner above an active region of a transistor, said protective liner covering a gate electrode structure formed on said active region, said gate electrode comprising a dielectric cap layer, wherein the protective liner is formed on and in contact with the gate electrode structure and on and in contact with an upper surface of the dielectric cap layer;
   performing a first ion implantation process to form drain and source extension regions by incorporating a drain and source dopant species in said active region through said protective liner;
   forming a spacer element on and in contact with said protective liner;
   removing an exposed portion of said protective liner by using said spacer structure as an etch mask so as to thereby expose the upper surface of the dielectric cap layer and portions of the active region; and
   performing a second ion implantation process to form drain and source regions in said exposed portions of said active region by using said spacer element as an implantation mask; and
   performing a common etch process to remove said spacer element and said dielectric cap layer of said gate electrode structure after forming said drain and source regions.

10. The method of claim 9, wherein a non-removed portion of said protective liner acts as an etch stop material during the common etching process.

11. The method of claim 9, wherein performing said common etch process further comprises preparing exposed surface areas of said drain and source regions for forming a metal silicide therein.

12. The method of claim 9, wherein forming said spacer element comprises depositing a silicon oxide material on said protective liner and patterning said silicon oxide material by using said protective liner as an etch stop layer.

13. The method of claim 9, further comprising forming said gate electrode structure so as to include a high-k dielectric material.

14. The method of claim 9, further comprising patterning said protective liner by using said spacer element as an etch mask.

15. The method of claim 14, wherein said protective liner is patterned prior to forming said drain and source regions.

16. The method of claim 14, wherein said protective liner is patterned after forming said drain and source regions.

17. The method of claim 9, further comprising forming a strain-inducing dielectric layer above said active region and said gate electrode structure after removing said spacer element.

* * * * *